United States Patent
Usoskin et al.

(10) Patent No.: US 9,008,741 B2
(45) Date of Patent: Apr. 14, 2015

(54) SUPERCONDUCTING STRUCTURE COMPRISING COATED CONDUCTOR TAPES, IN PARTICULAR STAPLED PERPENDICULARLY TO THEIR SUBSTRATE PLANES

(71) Applicant: Bruker HTS GmbH, Hanau (DE)

(72) Inventors: Alexander Usoskin, Hanau (DE); André Aubele, Hanau (DE)

(73) Assignee: Bruker HTS GmbH, Hanau (DE)

( * ) Notice: Subject to any disclaimer, the term of this patent is extended or adjusted under 35 U.S.C. 154(b) by 67 days.

(21) Appl. No.: 13/760,110

(22) Filed: Feb. 6, 2013

(65) Prior Publication Data

US 2013/0203604 A1    Aug. 8, 2013

(30) Foreign Application Priority Data

Feb. 8, 2012 (EP) ..................................... 12154480

(51) Int. Cl.
     *H01L 39/24*     (2006.01)
     *H01B 12/02*     (2006.01)
     *H01L 39/14*     (2006.01)
     *H01L 39/08*     (2006.01)

(52) U.S. Cl.
     CPC .............. *H01B 12/02* (2013.01); *H01L 39/143* (2013.01); *H01L 39/08* (2013.01)

(58) Field of Classification Search
CPC .. H01L 39/143; H01L 39/248; H01L 39/2419
See application file for complete search history.

(56) References Cited

U.S. PATENT DOCUMENTS

| | | | |
|---|---|---|---|
| 7,774,035 B2 | 8/2010 | Lee | |
| 2005/0173679 A1* | 8/2005 | Mannhart et al. | 252/500 |
| 2008/0210454 A1* | 9/2008 | Fee et al. | 174/125.1 |
| 2012/0309631 A1 | 12/2012 | Arndt | |

FOREIGN PATENT DOCUMENTS

EP      0 545 608      6/1993

* cited by examiner

*Primary Examiner* — Colleen Dunn
(74) *Attorney, Agent, or Firm* — Paul Vincent (57) ABSTRACT

A superconducting structure (1) has a plurality of coated conductor tapes (2; 2a-2o), each with a substrate (3) which is one-sided coated with a superconducting film (4), in particular an YBCO film, wherein the superconducting structure (1) provides a superconducting current path along an extension direction (z) of the superconducting structure (1), wherein the coated conductor tapes (2; 2a-2o) provide electrically parallel partial superconducting current paths in the extension direction (z) of the superconducting structure (1), is characterized in that the coated conductor tapes (2; 2a-2o) are superconductively connected among themselves along the extension direction (z) continuously or intermittently. A more stable superconducting structure with which high electric current strengths may be transported is thereby provided.

32 Claims, 8 Drawing Sheets

SUPERCONDUCTING STRUCTURE COMPRISING COATED CONDUCTOR TAPES, IN PARTICULAR STAPLED PERPENDICULARLY TO THEIR SUBSTRATE PLANES

This application claims Paris convention priority of EP 12 154 480.3 filed Feb. 8, 2012 the entire disclosure of which is hereby incorporated by reference.

BACKGROUND OF THE INVENTION

The invention relates to a superconducting structure comprising a plurality of coated conductor tapes, each with a substrate which is one-sided coated with a superconducting film, in particular an YBCO film,
wherein the superconducting structure provides a superconducting current path along an extension direction (z) of the superconducting structure,
wherein the coated conductor tapes provide electrically parallel partial superconducting current paths in the extension direction (z) of the superconducting structure.

Such a superconducting structure is known from DE 10 2009 028 413 A1.

Superconductors are used to carry electric currents, typically with a high current strength, and may be included in different applications, such as current transfer lines or magnetic coils.

Superconductors may, at a temperature below the so called critical temperature Tc, carry the electric current at practically no ohmic losses. In order to achieve said low temperature, the conductor is typically cooled, for example with liquefied gases such as liquid helium. Further, to have a superconducting state, it is also necessary to stay below a critical current density and below a critical magnetic field with the conductor.

When using high temperature superconductor (HTS) materials, e.g. yttrium barium copper oxide (YBCO) material, higher temperatures, current densities and magnetic fields become accessible. Since known HTS materials are brittle, HTS material is typically used as a film (or coating) on a normally-conducting or insulating substrate. Currently, most applications of HTS materials are based on coated conductor tapes, wherein the tapes provide some mechanical flexibility to the coated conductor.

The superconducting film deposited on a substrate tape is relatively thin, and limits the absolute current strength that may be transported through the coated conductor. In order to increase the absolute current strength that may be transported, it is known to electrically connect a plurality of coated conductor tapes in parallel.

DE 10 2009 028 413 A1 discloses a HTS current lead device for connecting a superconducting current consumer with a current supply point, with the device comprising several HTS tapes arranged on a support in parallel and spaced apart from each other. Note that this structure is rather large scaled, and the support makes the structure unflexible.

U.S. Pat. No. 7,774,035 B2 discloses superconducting articles wherein two superconductor tapes are bonded together, with the superconducting films facing away from each other.

In these superconducting structures, a coated conductor may easily be overloaded and lose its superconducting state ("quench"), what in turn often leads to a quench of the complete superconducting structure. Furthermore, the critical or quench current threshold is not sufficient.

It is the object of the invention to provide more stable superconducting structure with which high electric current strengths may be transported.

SUMMARY OF THE INVENTION

This object is achieved, in accordance with the invention, by a superconducting structure as introduced in the beginning, characterized in that the coated conductor tapes are superconductively connected among themselves along the extension direction continuously or intermittently.

In known superconducting structures, the total electric current is spread between the coated conductor tapes at their ends, and the current distribution is thus fixed over the length of the tapes. In contrast, in the inventive superconducting structure, the current distribution between the coated conductor tapes may change along the extension direction, since the coated conductor tapes or their superconducting films, respectively, are superconductively connected along their extension direction (z). By this means, a local defect in one of the coated conductor tapes may be bypassed locally; the coated conductor tape having the defect may still contribute to the current carrying capacity of the superconductive structure at a distance (in z) from its defect (where, in turn, possibly another coated conductor tape may have a local defect to be bypassed). Accordingly, the current carrying capacity of the superconducting structure is used more efficiently.

The superconductive connection between two coated conductor tapes along the extension direction z may be continuous, what allows a redistribution of currents everywhere along the extension direction, or intermittent, what allows a redistribution at every connection area located along the extension direction. Coated conductor tapes connected intermittently along the extension direction are not only connected at the ends of the coated conductor tapes, but also several times between the ends, typically in a periodic way, and preferably over at least one third of the total length (in z) of the superconducting structure. Typically, in case of an intermittent connection, there are at least ten (and often several hundred) separate connection areas per pair of connected coated conductor tapes along the extension direction (z) of the superconducting structure.

A coated conductor tape of the inventive superconductive structure, which provides a superconductive current path for a part of the current to be conducted ("partial superconductive current path"), is directly superconductively connected to at least one—and typically two or three—further coated conductor tapes, wherein the superconducting film sides of said coated conductor tape and said at least one further coated conductor tape face each other.

The opposing superconducting films typically touch each other or are separated only by a thin solder layer, in particular of a noble metal or noble metal alloy (preferably containing gold and/or silver), or by a combination of a thin solder layer, in particular of a noble metal or noble metal alloy (preferably containing gold and/or silver) and thin capping layers (typically of copper) of the coated conductor tapes, so that—if at all—only a negligible electric resistance is introduced, and superconductivity is maintained across the connection, i.e. a redistribution of currents between the opposing superconducting films does not result in a quench. Note that a solder layer may contain tin and/or may be free of noble metals, if desired. With a total thickness of the solder layer and possible capping layers of 100 μm or less at the connection, preferably 30 μm or less, a negligible ohmic resistance can normally be achieved.

Note that connected coated conductor tapes facing each other with their superconducting film sides typically only partially overlap with respect to a direction (y, y') in parallel to the substrate planes and perpendicular to the extension direction (z), in order to enlarge the structure in y, y'-direction. However, coated conductor tapes contributing to an enlargement of the superconducting structure in direction x, x' basically perpendicular to the substrate planes may also have a complete overlap in y, y'-direction (such as Y-elements, see below).

In accordance with the invention, it is not necessary that each coated conductor tape providing one of the parallel partial current paths is directly superconductively connected to every other such coated conductor tape; an indirect connection (i.e. via one or more other coated conductor tapes) is sufficient for the redistribution of the current among these coated conductor tapes. If desired, the coated conductor tapes may be linearly connected (in the xy cross-sectional plane), so that each coated conductor tape has only two direct connections at maximum; when using also coated conductor tapes connected to three or even more coated conductor tapes, a true 2-dimension network in cross-section perpendicular to z may be realized.

Note that the coated conductor tapes each have a length (in z direction) which is much larger, typically at least ten times larger, than their width (in y, y'-direction); the width in turn is much larger, typically at least ten times larger, than their height (in x, x' direction).

The coated conductor tapes are typically stacked (arranged one above the other) in a direction (x, x') basically perpendicular the substrate planes (or tape surfaces, respectively) of the coated conductor tapes. Note that a superconducting structure includes typically at least four coated conductor tapes, and preferably more than ten coated conductor tapes providing superconducting partial current paths. The superconducting films preferably include HTS material, such as YBCO.

Typical and preferred applications for the inventive superconducting structures are superconducting cables. Note that a superconducting structure does not need to run straight in an extension direction z, but may be bent or curved, in particular in cable applications.

Embodiment Forming a Labyrinth Structure

In a preferred embodiment of the inventive superconducting structure, the coated conductor tapes form a labyrinth structure comprising at least three levels of coated conductor tapes, wherein the coated conductor tapes of each level are superconductively connected in a linear sequence in a direction (y, y') basically parallel to the substrate planes and perpendicular to the extension direction (z), wherein the linear sequences of coated conductor tapes of the at least three levels overlap at least for the most part in said direction (y, y') basically parallel to the substrate planes and perpendicular to the extension direction (z), and wherein the coated conductor tapes of each two levels neighboring in a direction (x, x') basically perpendicular to the substrate planes of the coated conductor tapes are superconductingly connected to each other via at least one of their coated conductor tapes each, in particular via a lateral coated conductor tape of the level, thus allowing a balancing of currents within the superconducting structure in said direction (x, x') basically transverse to the respective substrate planes of the coated conductor tapes.

In addition to a balancing of currents in parallel to the substrate planes (across the width of the coated conductors), also a balancing of currents (or a free distribution of currents) in a direction (x, x') basically perpendicular to the substrate planes is provided; typically, the coated conductors build a stack in the x, x'-direction for this purpose. With these degrees of freedom for the electric current, an overload of the superconductive structure is even less likely, and compact superconducting structures extendable to practically any current carrying capacity are feasible. The invention allows a balancing of currents in said direction (x, x') transverse to the respective substrate planes typically within at least four, preferably at least ten coated conductor tapes (or their respective levels) arranged next to each other in said direction (x, x'). Typically, the superconductive connection between levels is done via lateral coated conductor tapes (which are at the side ends of a respective level with respect to the y, y' direction), with one end connecting upwards and one end connecting downwards in x, x' direction (thus allowing a "back and forth" redistribution of currents in y direction within the labyrinth structure). In order to achieve a true 2-dimensional network in the cross-section perpendicular to z, multiple connections between each two neighboring levels may be established. Note that the superconductive connections of the labyrinth structure are, as explained above, continuously or intermittently in the extension direction z.

Surprisingly, the total critical current of a labyrinth structure exceeds the sum of the particular critical currents of the parallel coated conductor tapes taken along (comprised). This effect is not fully understood by the inventors, because the critical current gain is more than what should follow from the effect of bypassing of local defects (i.e. the effect of mutual shunting). Typically, the gain reaches 30% to 50%, what is at least two times higher than one may expect from current bypassing.

Another effect that may be achieved in the labyrinth structure is a suppressing of coated conductor tape damage in the course of a quench event. "Wider" distributed current in the labyrinth structure creates smoothed overheated spots ("hot spots") with a temperature which is typically below the damage threshold.

Embodiments Relating to Free Space in the Structure

In a preferred embodiment of the inventive superconducting structure, free space in the superconducting structure not filled with coated conductor tapes is minimized, in particular wherein coated conductor tapes neighboring in a direction (x, x') basically perpendicular to the substrate planes of the coated conductor tapes flatly abut each other. In this way, the superconducting structure is particularly compact and easy to handle.

In an advantageous embodiment, free space in the superconducting structure not filled with coated conductor tapes is partially or completely filled with metal or a dielectric material. Such fillings may generally mechanically adjust, in particular stabilize, the structure. By means of a metal filling, the shunt protection may be improved.

Further, another preferred embodiment provides that free space in the superconducting structure not filled with coated conductor tapes is partially or completely filled with a cooling agent, in particular wherein the cooling agent exhibits a mass flow in the extension direction. By means of the cooling agent, the coated conductor tapes may be efficiently cooled, and the free space is advantageously used. Typical cooling agents to be used are liquefied gases, in particular LN2 and LHe. In the direction of the extension direction z, a laminar flow of the cooling agent is easy to establish.

Embodiments Relating to the Basic Structure

In a preferred embodiment, the coated conductor tapes are slightly curved in a cross-section perpendicular to the extension direction (z). In this way the structure can be adjusted to external needs, such as the desired installation path of a cable made from the structure. Note that by bending around the extension direction z over some distance in z, a structure of geometrically parallel coated conductor tapes may be bent over the short side in a desired direction which represented a non-accessible direction (such as the long side of the coated conductor tapes) before.

Particularly preferred is an embodiment wherein the coated conductor tapes are periodically arranged in a direction (x, x') basically perpendicular to the substrate planes. By means of a periodic arrangement, a simple structure which can be extended as needed is provided. Typically there are at least three, preferably at least ten repetition units in x, x'-direction. Note that the superconducting structure may (independent of a periodicity in x, x'-direction) also be periodic in y, y'-direction, such as with two or more, preferably five or more repetition units.

A further advantageous embodiment provides that at least some of the coated conductor tapes each are bent such that a first part of the width of the coated conductor tape is offset with respect to a second part of the coated conductor tape in a direction (x, x') basically perpendicular to the substrate plane. By means of said bending, the x, x'-dimension can be accessed in a particularly simple way for a superconducting structure.

Embodiment Relating to Stacks

Further preferred is an embodiment wherein the coated conductor tapes are stacked in a direction (x, x') basically perpendicular to the substrate planes, thus forming a stack. By means of a stack, in which coated conductors are arranged one above the other (and possibly, but not necessarily abutting all next neighbors in x,x'-direction within the stack), a particularly compact superconducting structure can be achieved, accessing the x, x'-dimension. The electric current can be distributed differently in x, x'-direction within the stack along the extension direction z. A stack typically comprises at least four, preferably at least ten coated conductor tapes stacked in x, x'-direction. Note that the stack is typically periodic in x, x'-direction. Further note that the stack may include several coated conductor tapes per x, x'-direction level (tape layer), typically wherein said several coated conductor tapes partially overlap in y, y'-direction.

A further development of this embodiment provides that at least some coated conductor tapes within the stack each are superconductively connected at least to a first further coated conductor tape and a second further coated conductor tape,
wherein the first further coated conductor tape directly or indirectly establishes a superconducting connection of the coated conductor tape to coated conductor tapes above said coated conductor tape within the stack,
and wherein the second coated conductor tape directly or indirectly establishes a superconducting connection to coated conductor tapes below said coated conductor tape within the stack. By this means, a superconductive connection chain within the stack can be established.

Embodiment Relating to a Ring Structure

In a particularly preferred further development of the above embodiment, the coated conductor tapes are stacked in a closed ring shaped fashion, thus forming a ring-shaped stack, with the circumferential direction (x') of the ring-shaped stack basically perpendicular to the substrate planes. In the ring-shaped stack, the coated conductor tapes are arranged one above another, with a slight tilt relative to each other; the next neighbors of coated conductor tapes in x'-direction typically do not abut flatly here, and/or at least a part are even spaced apart. In this structure, the electric current may also balance in circumferential direction. Preferably, the ring-shaped stack includes a core free from coated conductor tapes. Further preferably, the density of coated conductor tapes along the circumference of the ring-shaped stack is constant, and the ring-shaped stack is circular. Then circular magnetic fields of high quality are achievable, although tape type coated conductors are used for their generation.

Embodiments Relating to Spacers

In a further development, the superconducting structure includes spacers filling spaces in at least one non-dense section of the superconducting structure in which less coated conductor tapes are stacked in the direction (x; x') basically perpendicular to the substrate planes than in a dense section in which the coated conductor tapes neighboring in the direction (x, x') basically perpendicular to the substrate planes abut each other. By means of spacers, thickness differences between dense and non-dense sections in stacks can be leveled. This increases the stability of the superconducting structure. In particular, it is possible to have all coated conductor tapes flatly abutting to next neighbor coated conductor tapes or spacers. Note that stacks not comprising any dense sections are typically not equipped with spacers.

If desired, the spacers comprise coated conductor tape pieces, which are not superconductively connected to another coated conductor tape, and which are bent inwards the superconducting structure. If the structure provides no dedicated edge tapes, the coated conductor tapes at the edges (which are often not included in any current carrying function) may be bent in so they can still take over a spacer function. The double material in the bent region fills in the non-dense sections with the proper height.

Embodiments Relating to Y-Elements

Particularly advantageous is an embodiment wherein the superconducting structure comprises at least one Y-element, each with two coated conductor tapes facing each other with their respective superconducting film sides, wherein said two coated conductor tapes are superconductingly connected along the extension direction (z) continuously or intermittently in a connection region, and wherein said two coated conductor tapes are spaced apart in a direction (x, x') basically perpendicular to the substrate planes in a transfer region on one side of the connection region. By means of Y-elements, the x, x'-direction can easily be accessed for the coated conductors. A Y-element provides a bifurcation-like structural element for this purpose. Typically, the superconducting structure comprises a plurality of Y-elements, which are directly or indirectly interconnected. At the transfer region, the two coated conductor tapes may be superconductively connected to a further coated conductor tape each. One or both of the further coated conductor tapes may be in turn part of Y-elements.

In a preferred further development of this embodiment, the two coated conductor tapes of the Y-element extend differently far within the transfer region in a direction (y, y') basically parallel to the substrate planes and perpendicular to the extension direction (z). By this means, thickness differences in stacks comprising dense sections can be kept small.

Embodiments Relating to Double Y-Elements

In another further development, the Y-element comprises an additional transfer region in which the two coated conductor tapes are spaced apart in a direction (x, x') basically perpendicular to the substrate planes, wherein the transfer region and the additional transfer region are separated by the connection region. Such double Y-elements may in particular bridge between lateral Y-elements (and further double Y-elements and/or S-elements, see below). Double Y-elements allow a true 2-dimensional connection network in cross-section perpendicular to the z direction. More specifically, with the double Y-elements, honeycomb-like structures may be built, providing a particularly safe and flexible connection network.

Embodiment Relating to Protrusions and Recesses

A highly preferred further development provides that said two coated conductor tapes of the Y-element in the transfer region comprise protrusions and recesses with respect to a direction (y, y') basically parallel to the substrate planes and perpendicular to the extension direction (z), alternating in the extension direction (z), and that the protrusion and recess patterns of said two coated conductor tapes are offset in the extension direction (z). This avoids thickness differences within the superconducting structure. Due to the offset, protrusions of one of the two coated conductor tapes coincide (in z) with recesses of the other of the two coated conductor tapes.

Embodiment Relating to S-Elements

In an advantageous embodiment, the superconducting structure comprises at least one S-element, with two coated conductor tapes facing each other with their respective superconducting film sides, wherein said two coated conductor tapes are superconductively connected in a connection region, and wherein the two coated conductor tapes extend beyond the connection region on opposing sides in a direction (y, y') basically in parallel with the substrate planes but basically perpendicular to the extension direction (z). By means of S-elements, a superconducting structure may be extended in y, y'-direction by simple means. S-elements may in particular bridge between lateral Y-elements (and further S-elements and/or double-Y-elements).

Embodiment Relating to Solder and Capping Layers

Finally, a preferred embodiment provides that each two coated conductor tapes superconductively connected face each other with their superconducting film sides, and the superconducting films are electrically connected
by touching each other directly, or
across a solder layer, in particular of a noble metal or a noble metal alloy, or
across capping layers, in particular copper capping layers, of the coated conductor tapes and a solder layer, in particular of a noble metal or a noble metal alloy. While a direct touching of the superconducting films may result in a highest quality contact, intermediate solder and/or capping layers are often used since they are easier to handle during production, in particular as far as durability of the contact is concerned. In practice, some negligible (i.e. very low) ohmic resistance is almost inevitably introduced at any connection of each two opposing coated conductor tapes (in particular if one or more intermediate layers are used), but due to the large contact area (along the length of the parallel tapes), this ohmic resistance does not impair the use of the inventive superconducting structure as a whole. Accordingly, such quasi-superconductively connected coated conductor tapes are still considered to qualify as a superconducting connection in accordance with the invention.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Figure 1:
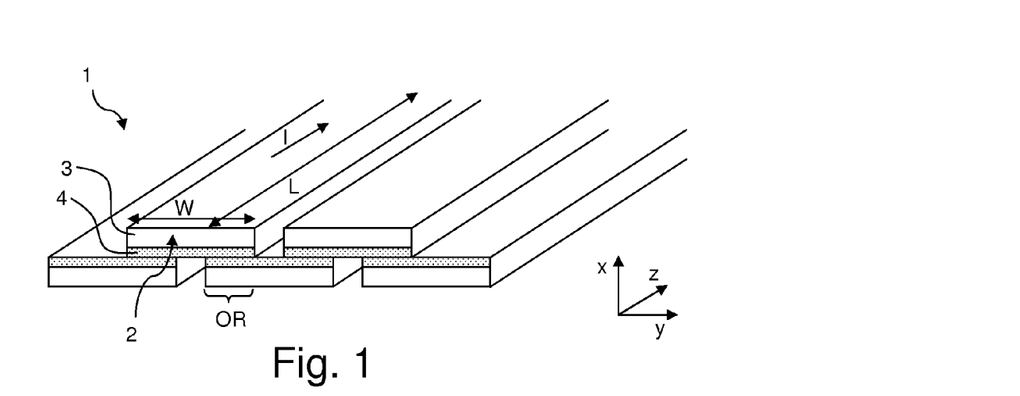
FIG. 1 a schematic, perspective and partially cross-sectional view of an embodiment of an inventive superconducting structure, with coated conductor tapes connected in a chain-like fashion in a direction (y) basically in parallel to the substrate planes and perpendicular to an extension direction (z) of the coated conductor tapes.

FIG. 1 illustrates an embodiment of an inventive superconducting structure 1. The structure 1 (and the superconducting structures 1 introduced in the following figures) is supposed to carry an electric current I superconductively in an extension direction z.

The structure 1 comprises here five coated conductor tapes 2, each with a substrate 3 and a superconducting film 4 on (only) one of its sides, well visible in the cross-section in the front part of the figure. For example, the substrate 3 may be of a flexible steel type, and the superconducting film 4 may comprise YBCO material. Note that one or more buffer layers may be deposited between the substrate 3 and the superconducting film 4, and further auxiliary layers known in the art may be provided, if needed.

The coated conductor tapes 2 face each other with their superconducting films 4. Apart from the outer (in FIG. 1 most left and most right) coated conductor tapes 2, each coated conductor tape 2 overlaps with a part of its width W over its full length L with two other coated conductor tapes 2, with an offset (i.e. being shifted) in a direction y basically in parallel with the substrate planes and perpendicular to the extension direction z. In the overlap region OR (which extends in z direction over the complete length L), the overlapping coated conductor tapes 2 here are continuously superconductively connected. Accordingly, electric current I flowing superconductingly in z direction may be redistributed in y direction between all superconducting films 4 of the five coated conductor tapes 2; the coated conductor tape 2 (or their superconducting films 4, respectively) represent parallel current paths.

Figure 2:
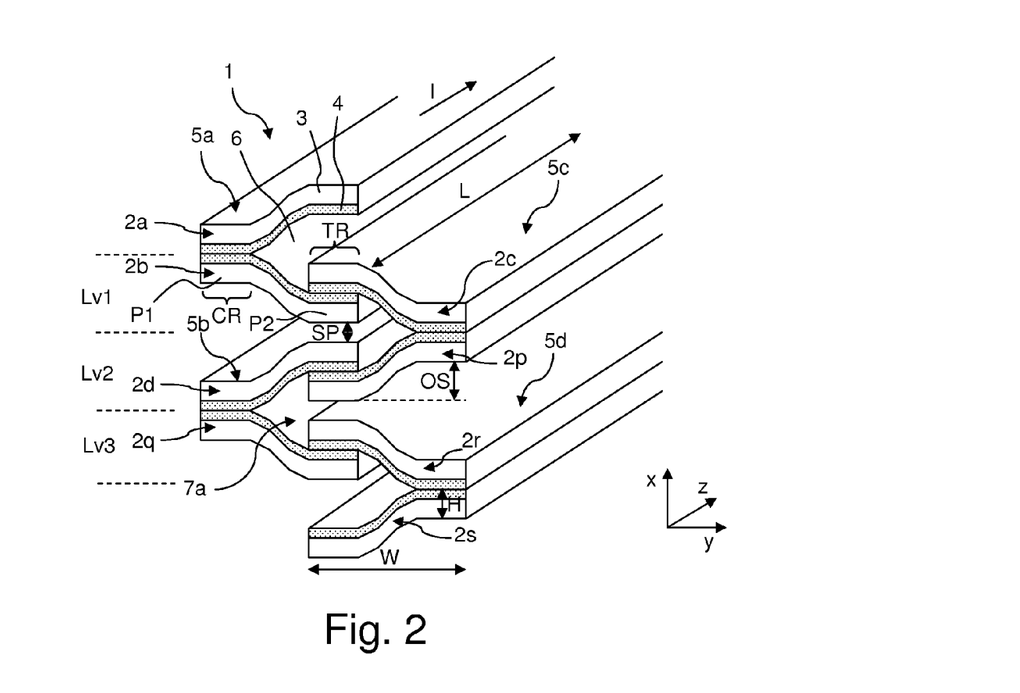
FIG. 2 a schematic, perspective and partially cross-sectional view of an embodiment of an inventive superconducting structure of labyrinth type, based on Y-elements stacked in a direction (x) basically perpendicular to the substrate planes of the superconductive structure, with a non-dense stack.

FIG. 2 shows an embodiment of an inventive superconducting structure 1 based on Y-elements 5a-5d. The shown structure 1 here comprises four interconnected Y-elements 5a-5d, but may be extended periodically as desired in x direction.

A Y-element 5a comprises two coated conductor tapes (also referred to as coated conductors) 2a, 2b, each with a substrate 3 and a superconducting film 4, with the superconducting film sides facing each other. In a connection region CR, the superconducting films 4 of the coated conductor tapes 2a, 2b are (here) continuously superconductively connected over their full length L along the extension direction z. In contrast, in a transfer region TR, the coated conductor tapes 2a, 2b are spaced apart from each other, such that a mouth-like opening 6 results in cross-section (Note that in the figures, the dimensions in x direction, including the height H of the coated conductor tapes, is shown enlarged as compared to the dimensions in y direction, including width W, for easier comprehension).

A coated conductor tape, see e.g. coated conductor tape 2b, in the transfer region TR (or in the mouth like opening 6, respectively) may be superconductively connected (here continuously over the full length L of the coated conductors) to another coated conductor tape, see e.g. coated conductor tape 2c of a further Y-element 5c. Accordingly, electric current I may be transferred between the Y-elements 5a, 5c in the transfer region TR.

The latter Y-element 5c is in turn superconductively connected to Y-element 5b, and the latter to Y-element 5d, so free distribution of the electric current I flowing in z direction (or a balancing of currents, respectively) within the parallel coated conductor tapes may occur along the chain of electrically interconnected Y-elements 5a-5c-5b-5d, and thus also in a direction x basically perpendicular to the substrate planes which are basically parallel to the yz plane here.

Please note that in accordance with the invention, connecting regions CR and the transfer regions TR typically have about the same width in y direction. It is also possible to choose the widths of said regions differently, in particular with the transfer regions TR wider than the connection regions CR in y direction, in order to mechanically stabilize a center of the superconducting structure 1.

The superconducting structure 1 of FIG. 2 is of a labyrinth type, comprising coated conductor tapes in three levels, namely Lv1 (with tapes 2b, 2c), further Lv2 (with tapes 2p, 2d), and further Lv3 (with tapes 2q, 2r). Within each level Lv1-Lv3, the coated conductor tapes 2b, 2c, 2p, 2d, 2q, 2r are connected in linear sequence in y direction; the three levels Lv1-Lv3 (or their coated conductors, respectively) overlap in y direction. Here at the lateral ends of the levels Lv1-Lv3, there are connections to the levels neighboring in x direction. For example, Lv2 is connected on the right end via its coated conductor tape 2p to coated conductor tape 2c of Lv1, and on the left end via its coated conductor tape 2d to coated conductor tape 2q of Lv3. The connections between the levels Lv1-Lv3 allow a current redistribution in x direction between the levels, accordingly.

The coated conductor tapes, see for example coated conductor tape 2b, are somewhat bent, so that a first part P1 of the coated conductor tape 2b, here at the connection region CR, is offset (shifted) in x direction with respect to a second part P2 of the coated conductor tape 2b, here in the transfer region TR. By this means, the x direction becomes accessible for the superconducting structure 1, i.e. a superconducting connection may be established between coated conductors arranged one above the other in x direction ("stacked in x direction"). For example, coated conductor tapes 2d and 2b are connected via Y-element 5c by means of its two bent coated conductor tapes. This opens the possibility to redistribute the electric current I in the x direction superconductively. However, in practice, since the height H and the offset OS of the coated conductor tapes in x direction is small (on the order of a fraction of a millimeter) as compared to the width W of a coated conductor tape (on the order of ten millimeters and more), said two parts P1, P2 are in good approximation still in one plane.

In the example shown, coated conductor tapes 2b, 2d neighboring in x direction are spaced apart by a spacing SP. In other words, free space 7a within the structure 1 (not filled with coated conductors) is not minimized here. This gives the superconducting structure 1, although stacked, a good flexibility, in particular when bending the structure 1 upwards or downwards in x direction with e.g. its front end ("over the short side"). If needed, a support frame may be used to establish and define said spacing SP (not shown). When, as shown in FIG. 2, a minimum (non-zero) spacing SP is provided between at least some of the Y-elements 5a-5d (or, more generally, at least some of the coated conductor tapes) of a superconducting structure 1 neighboring in a stack in x direction, the stack can be called non-dense.

Figure 3:
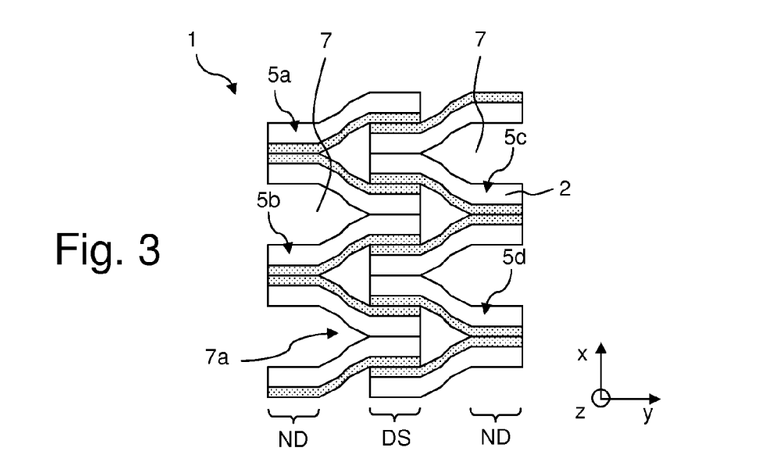
FIG. 3 a schematic cross-section of an embodiment of an inventive superconductive structure similar to FIG. 2, with the stack comprising a dense section and two non-dense sections.

FIG. 3 shows, now in cross-section only (for simplification, what also applies to the subsequent figures), a superconducting structure 1 similar to the one of FIG. 2, but with a dense section DS in the center of the structure 1. In the dense section DS, the neighboring Y-elements 5 (or the neighboring coated conductor tapes 2) are all flatly abutting each other, so no minimum spacing is kept. By this measure, free space 7a in the structure 1 is minimized here. This gives a very compact design.

However, on the outside, there are two non-dense sections ND showing empty spaces 7 remaining. The non-dense sections ND exhibit only half the number coated conductor tapes as compared to the dense section DS, what may lead to an unintentionally strong (and possibly damaging) bending, in particular when a large number of coated conductor tapes 2 is stacked in x direction.

In reality, the design of the superconducting structure 1 is significantly more compact than shown in the schematic FIG. 3 (and the further figures) because of a low aspect ratio, i.e. ratio of the thickness (height) of a coated conductor to its width; the aspect ratio yields typically from 1:20 to 1:200. Due to this, the volume content of a dense section DS may significantly dominate the volume content of non-dense sections ND as well as of sections located in between a dense section DS and a non-dense section ND.

Figure 4A:
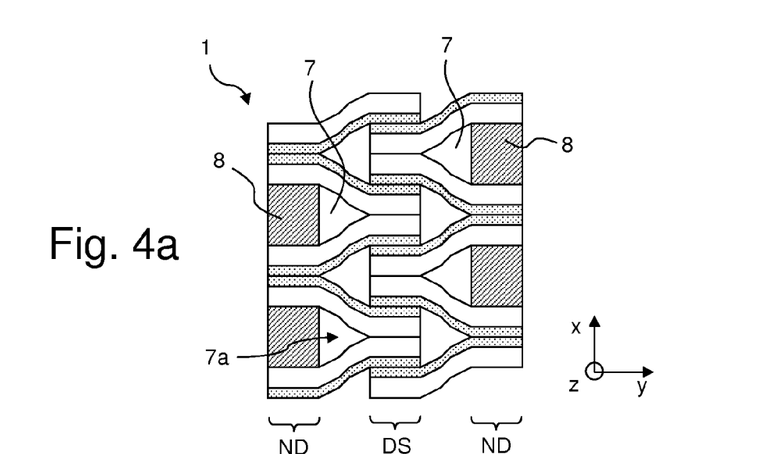
FIG. 4a a schematic cross-section of an embodiment of an inventive superconductive structure similar to FIG. 3, but with spacers filling spaces in the non-dense sections.

In order to avoid such a strong bending, in accordance with the invention, spacers 8 may be inserted into the spaces 7, compare FIG. 4a. The spacers 8, which are typically stripes (extending in z direction), may be of an arbitrary solid material; it may be useful to use a metal, in particular a well conducting metal such a copper, in order to provide a shunt resistance. In the example shown, the spacers 8 partially fill the free space 7a of the structure 1.

Figure 4B:
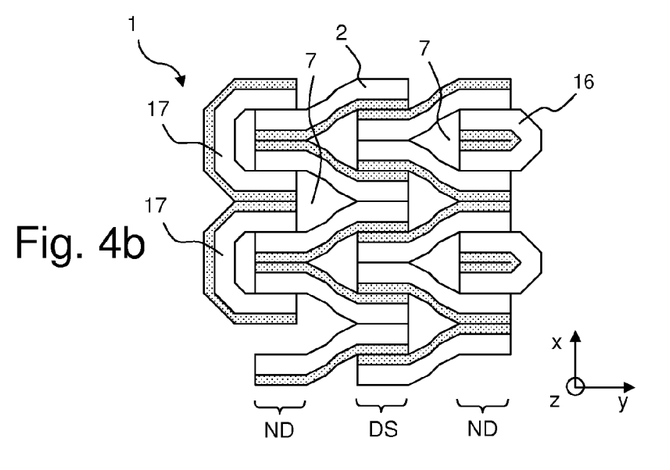
FIG. 4b a schematic cross-section of an embodiment of an inventive superconductive structure similar to FIG. 4a, wherein the spacers are inwardly bent coated conductor tape pieces.

During production of an inventive superconducting structure, it may be desirable to have as few as possible different processing steps, and in particular it may be desirable to avoid an additional material deposition process. In this case, coated conductor tape material may be used for filling purposes. As shown in FIG. 4b, coated conductor tape pieces 16, 17 bent inwardly towards the superconducting structure 1 may be used as spacers. The bent coated conductor tape pieces 16, 17 have exactly the correct height in x-direction to fill the empty spaces 7 in the non-dense sections ND. Note that each space 7 may be filled simply with one coated conductor tape piece 16, or with the ends of two coated conductor tape pieces 17 (then each coated conductor tape piece 17 may contribute to the filling of two spaces 7). The coated conductor tape pieces 16, 17 with a spacer function are preferably not superconductively connected to the coated conductor tapes 2 carrying the superconducting electric current within the superconductive structure 1.

Figure 5A:
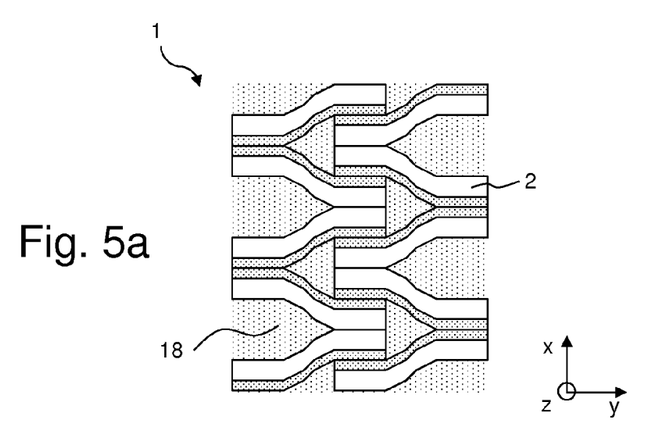
FIG. 5a a schematic cross-section of an embodiment of an inventive superconductive structure similar to FIG. 3, with a dielectric filling free space of the structure.

FIG. 5a illustrates an embodiment of an inventive superconducting structure 1 comparable to the one shown in FIG. 3, but with a dielectric material (e.g. of epoxy type, marked lightly dotted) 18 filling the free space of the structure 1. The dielectric (electrically insulating) material 18 is preferably applied in a liquid form, so a complete (or almost complete) filling of the free space may be achieved, and hardened later on, so a mechanical stabilization can be achieved, comparable to or even better than the one achieved with spacers.

Figure 5B:
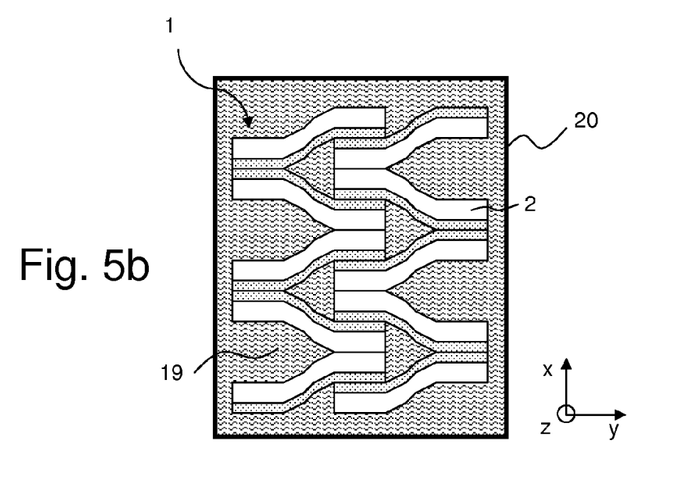
FIG. 5b a schematic cross-section of an embodiment of an inventive superconductive structure similar to FIG. 3, wherein a cooling agent, flowing within a tube and through the structure, cools the structure.

FIG. 5b shows an embodiment of an inventive superconducting structure 1 comparable to the structure shown in FIG. 3 again; here the structure 1 is put into a tubing 20, in which a cooling agent 19 (marked with a wavy pattern) flows in z direction (perpendicular to the plane of the cross-sectional drawing). The cooling agent 19, e.g. liquid helium (LHe), has an intimate contact to all parts of the structure 1, and therefore can provide a very efficient cooling function.

Accordingly, a temperature below the critical temperature Tc of the superconducting material of the coating conductor tapes 2 may be kept easily.

Figure 6:
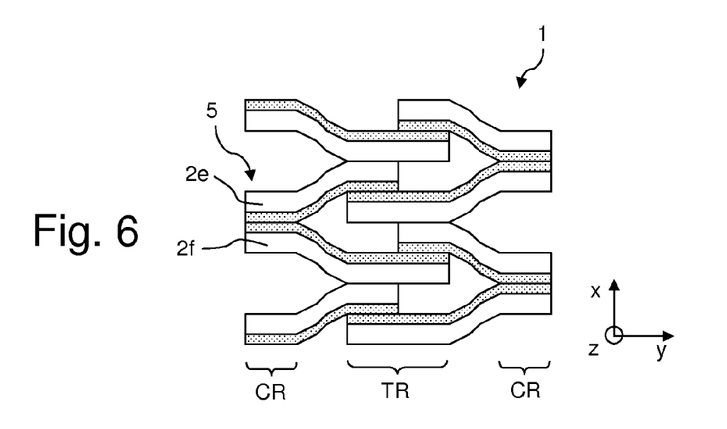
FIG. 6 a schematic cross-section of an embodiment of an inventive superconductive structure similar to FIG. 3, wherein the coated conductor tapes of each Y-element extend differently far into a transfer region.

In order to alleviate thickness differences between different sections in the cross-section of an inventive superconducting structure 1, it is also possible to let the coated conductor tapes 2 of a Y-element 5 reach differently far into the transfer region TR, compare FIG. 6. Here, the top coated conductor tape 2e of each Y-element 5 extends less far into the transfer region TR as compared to the bottom coated conductor tapes 2f, and the short top coated conductor tapes 2e of opposing Y-elements 5 do not overlap. Then the number of coated conductor tapes stacked in every part of the transfer region TR is only one and a half times the number of coated conductor tapes in the connection regions CR within the superconducting structure 1 (as compared to two times, in the embodiment of FIG. 3).

Figure 7A:
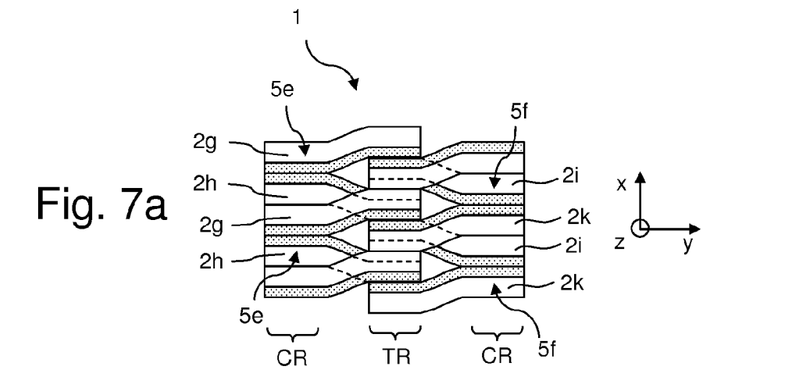
FIG. 7a-7b an illustration of an embodiment of an inventive superconductive structure similar to FIG. 3, wherein the coated conductor tapes have protrusions and recesses in a transfer region, in a schematic cross-section (FIG. 7a) and a schematic top view (FIG. 7b)
Figure 7B:
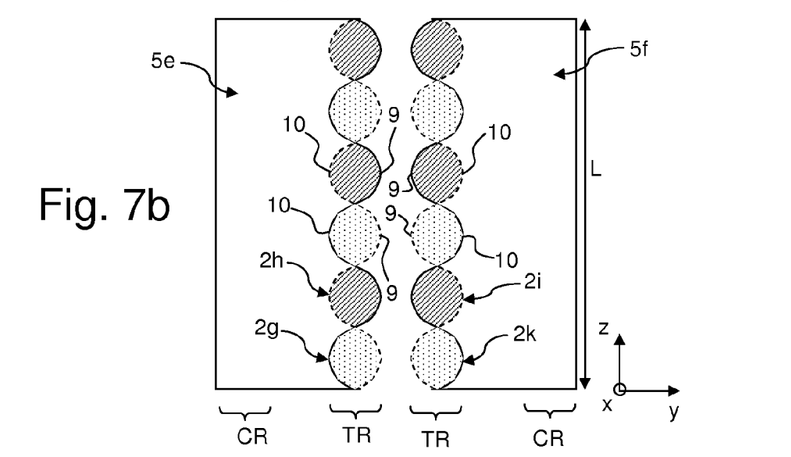

FIG. 7a (in cross-section) and FIG. 7b (in top view) illustrate a further embodiment of an inventive superconducting structure 1, also based on Y-elements 5e, 5f and of labyrinth type. The coated conductor tapes 2g-2k have protrusions 9 and recesses 10, reaching into and being retracted from the transfer region TR, and alternating in z-direction, here in a wave-like manner. The protrusions 9 and recesses 10 lead to a uniform number of coated conductor tapes stacked in x-direction all over the superconducting structure 1, namely both within the connecting regions CR and the transfer region TR.

In FIG. 7b (and in the overlaps in FIG. 7a), with the full lines, the contours of the top coated conductor tape 2g of Y-element 5e and the bottom coated conductor tape 2k of Y-element 5f are shown. With the dashed lines, the contours of the bottom coated conductor tape 2h of Y-element 5e and the top coated conductor tape 2i of Y-element 5f are shown (note that the Y-elements 5e on the left of the superconducting structure 1 are all identical, and the Y-elements 5f on the right of the superconductive structure 1 are all identical, too). For better understanding, the Y-elements 5e, 5f are shown pulled apart in y direction in FIG. 7b.

In Y-element 5e, at a z position where its top coated conductor tape 2g has a protrusion 9, the bottom coated conductor tape 2h has a recess 10. At the same z position, in the opposing Y-element 5f, the top coated conductor tape 2i has a recess 10, and the bottom coated conductor tape 2k has a protrusion 9. Accordingly, the left top coated conductor tape 2g and the right bottom coated conductor tape 2k can be superconductively connected at the protrusion overlap (hatched areas in FIG. 7b), whereas the left bottom coated conductor tape 2h and the right top coated conductor tape 2i do not overlap here.

Further, in Y-element 5e, at a z position where its bottom coated conductor tape 2h has a protrusion 9, the top coated conductor tape 2g has a recess 10. At the same z position, in the opposing Y-element 5f, the bottom coated conductor tape 2k has a recess 10, and the top coated conductor tape 2i has a protrusion 9. Accordingly, the left bottom coated conductor tape 2h and the right top coated conductor tape 2i can be superconductively connected at the protrusion overlap (dotted areas in FIG. 7b), whereas the left top coated conductor 2g and the right bottom coated conductor 2k do not overlap here.

By means of the protrusions 9, superconductive connections to another coated conductor tape may be established in the transfer region TR; the protrusion overlap establishes separated connection areas. The connections between two coated conductor tapes by means of the protrusions 9 are therefore intermittent along the extension direction z of the superconductive structure 1. In the example shown, any two coated conductor tapes connected via protrusion overlap have, in z direction, an overlap at about half of the total length L of the superconducting structure 1.

Figure 8:
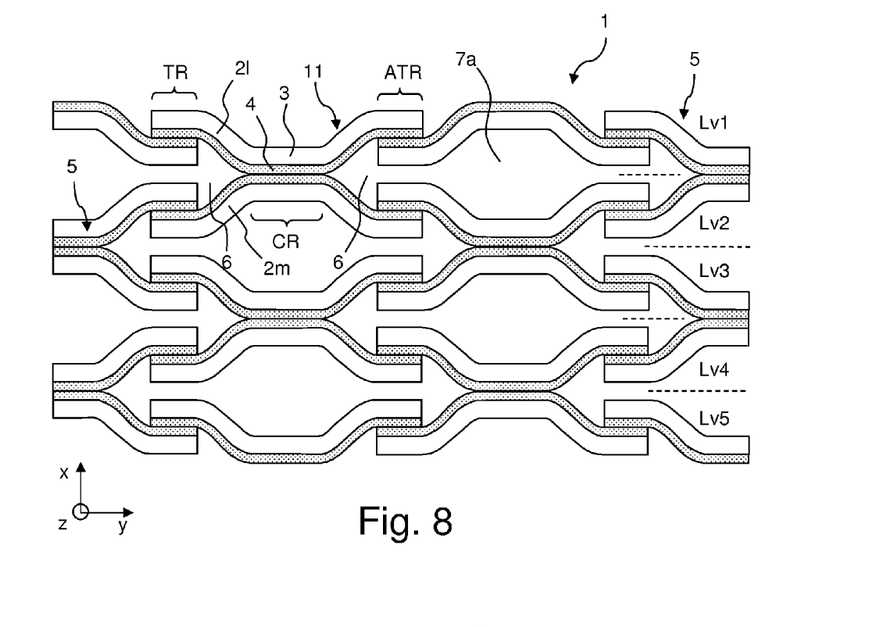
FIG. 8 a schematic cross-section of an embodiment of an inventive superconductive structure of labyrinth type, based on Y-elements and double Y-elements in a non-dense stack.

FIG. 8 shows an embodiment of an extended superconducting structure 1 in accordance with the invention. The structure 1 comprises on its outer (edge) sides Y-elements 5, which are interconnected via double Y-elements 11.

A double Y-element 11 comprises two coated conductor tapes 2l, 2m, facing each other with their superconducting film sides (see substrates 3 and superconducting films 4) which are superconductively connected at a central connection region CR, and spaced apart at mouth-like openings 6 in a transfer region TR and an additional transfer region ATR provided at the two sides of the connection region CR in y direction. At the transfer regions TR, ATR, coated conductor tapes, in particular of Y-elements 5 and double Y-elements 11, may be superconductively connected.

By means of double Y-elements 11, superconducting structures 1 with honeycomb like patterns in cross-section may be built (compare the approximately hexagonally shaped spaces 7a). Such a pattern provides multiple alternative currents paths (in the xy plane) for a superconducting current between any two coated conductor tapes in the superconducting structure 1. This increases the defect tolerance of the superconductive structure 1. Moreover, the honey comb like pattern is particularly flexible. High mechanical flexibility of the inventive superconductive structure 1 is particularly appreciated for superconducting cables.

The inventive structure 1 of FIG. 8 is also of labyrinth type, (here) with five levels Lv1-Lv5, each with (here) four coated conductor tapes connected in linear sequence. Each two levels neighboring in x direction, e.g. levels Lv1 and Lv2, are connected to each other multiple times here, namely both via a lateral Y-element 5 (on the right in FIG. 8 for Lv1 and Lv2) and via a double Y-element 11. Thus a true 2-dimensional network of interconnected coated conductor tapes in cross-section (perpendicular to z) is achieved.

Figure 9:
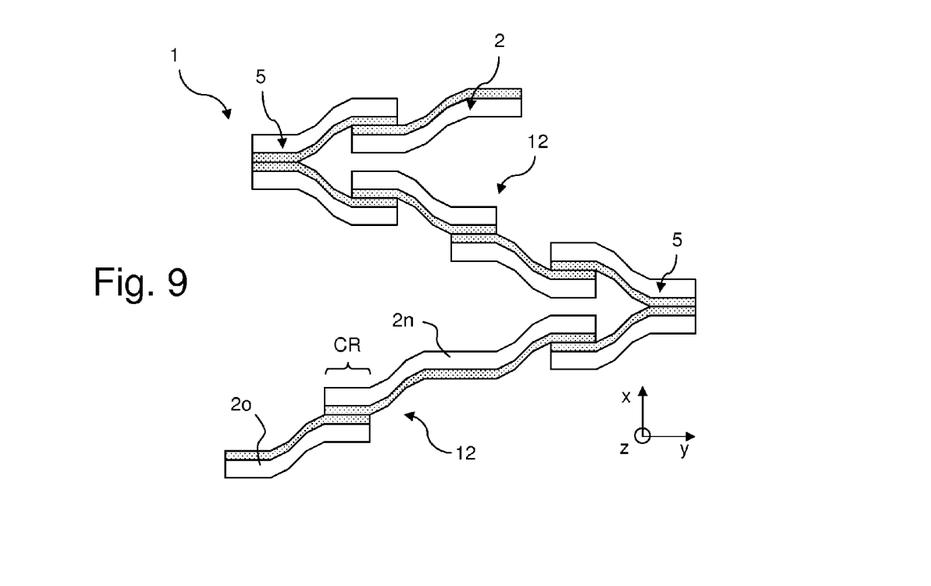
FIG. 9 a schematic cross-section of an embodiment of an inventive superconductive structure, based on interconnected Y-elements and S-elements.

FIG. 9 illustrates an embodiment of a superconducting structure 1 using a mixture of Y-elements 5 and S-elements 12 in an arbitrary design.

An S-element 12 comprises two coated conductor tapes 2n, 2o, facing each other with their superconducting film sides (see substrates 3 and superconducting films 4) and superconductively connected (here) continuously in a connection region CR where the two coated conductor tapes 2n, 2o overlap. Both coated conductor tapes 2n, 2o extend (in y direction) beyond the connecting region CR on opposing sides (right and left in the figure); these parts may be used for connecting to a further coated conductor tape (e.g. as part of a Y-element 5).

An S-element 12 may be used to superconductively connect two Y-elements 5, for example, as shown in FIG. 8.

Note that a superconducting structure 1 may also include singe coated conductor tapes 2 not belonging to Y-elements, double Y-elements or S-elements.

Figure 10:
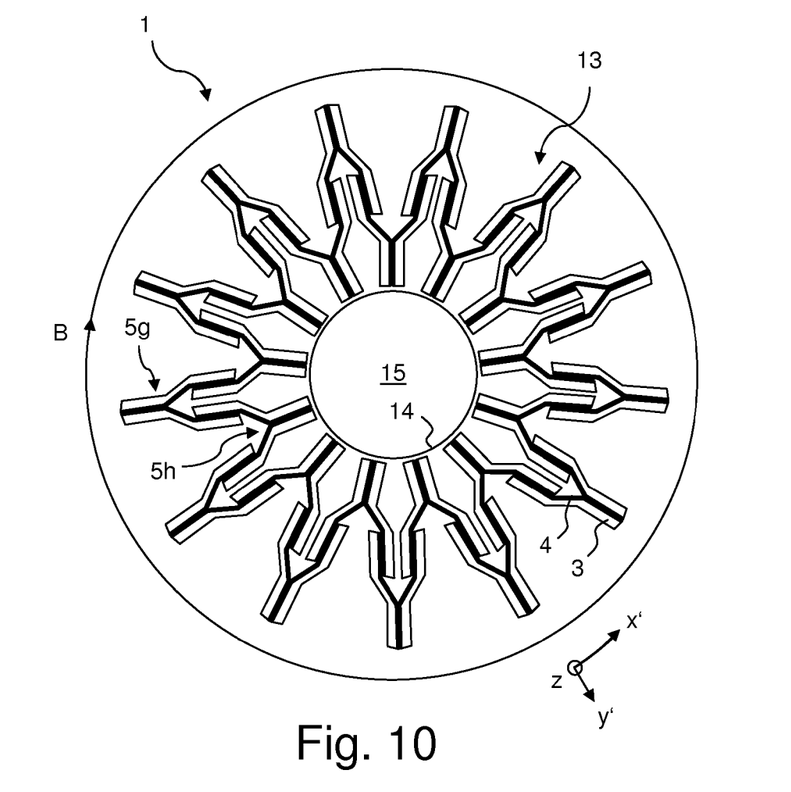
FIG. 10 a schematic cross-sectional view of an embodiment of an inventive superconductive structure of labyrinth type, based on Y-elements stacked in a closed ring-type fashion.

FIG. 10 illustrates another embodiment of an inventive superconductive structure 1.

This superconducting structure 1 is based on Y-elements 5g, 5h here, which build a ring-shaped stack 13, providing a closed superconducting current path around a core 15. Said core 15 may be separated from the superconducting structure 1 by means of a tube 14.

The Y-elements 5g, 5h are superconductively connected via superconducting films 4 (see thick black lines) on substrates 3 of coated conductor tapes 2 facing each other with their superconducting film sides, similar to the embodiment shown in FIG. 2. In the example shown, the radially inner Y-elements 5h are slightly differently bent as compared to the radially outer Y-elements 5g, here with the Y-elements 5h opening out with the coated conductor tape ends reaching radially outward, and the Y-elements 5g with parallel coated conductor tape ends reaching radially inward. Neighboring Y-elements 5h, 5g are slightly rotated with respect to each other. Preferably, the Y-elements 5g, 5h are evenly distributed around the circumference of the superconducting structure 1, and together have a basically circular shape. The Y-elements 5g, 5h or their coated conductor tapes, respectively, are stacked in circumferential direction x', which is perpendicular to the respective local substrate planes; the substrate planes are basically in parallel to the local y'z plane, with direction y' being the local radial direction here (which is in parallel with the local substrate planes, and perpendicular to the extension direction z).

The superconducting structure 1 provides a deeply distributed magnetic field along the radius. This field causes a more uniform interaction with entire structure 1 (compared e.g. to a typical conventional cable configuration), and as a result should homogenize a quench across entire radial depth.

Preferably, spaces within the ring-shaped (non-dense) stack 13 are not filled with spacers, so a maximum flexibility of the structure 1 is provided.

This superconducting structure 1 is particularly suited for use in a superconducting cable. The field-free core 15 can be used for a signal transmission save from external disturbances.

It should be noted that a ring-shaped stack 13, in accordance with the invention, need not be based on Y-elements only, but may include other elements, such as double Y-elements or S-elements, or coated conductor tapes not belonging to particular elements, too.

Figure 11:
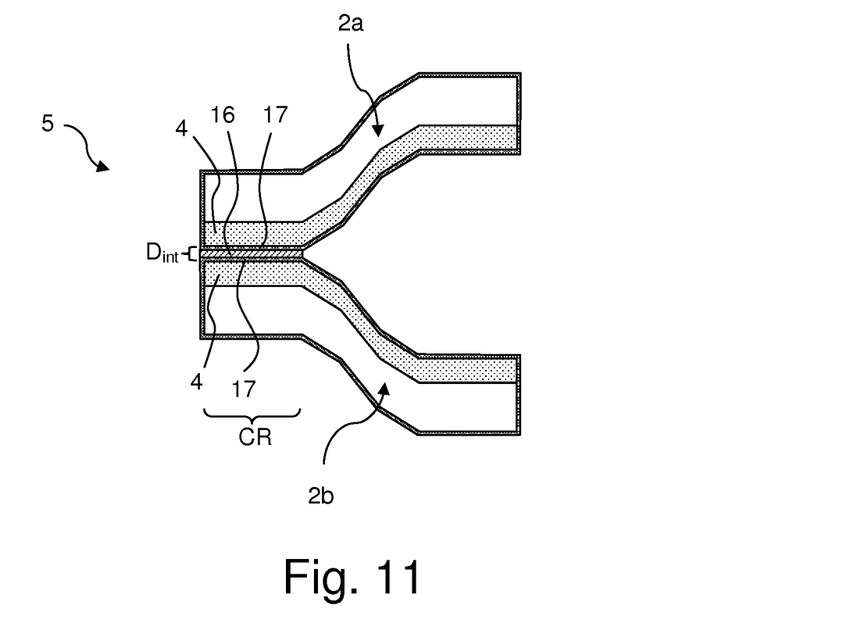
FIG. 11 a schematic cross-section of a Y-element for use with the invention.

FIG. 11 details an example of a Y-element 5 for use within an inventive superconducting structure. The Y-element 5 comprises two coated conductor tapes 2a, 2b, superconductively connected at a connection region CR. Here, the coated conductor tapes 2a, 2b are surrounded by a capping layer 17 of copper each, and at the connection region CR, the coated conductor tapes 2a, 2b are connected via a solder layer 16, for example containing silver and/or tin. Electric current running through the superconducting films 4 of the tapes 2a, 2b may redistribute between the films 4 across the capping layers 17 and the solder layer 16. Although these intermediate layers 16, 17 are normally conducting, no noticeable ohmic resistance results at the connection region CR, since the connection region CR is rather large due to its extension along the tapes (perpendicular to the plane of the drawing); this is true for both a continuous and an intermittent connection. Note that in accordance with the invention, the total thickness $D_{int}$ of any intermediate layers 16, 17 is in general 100 µm or less, preferably 30 µm or less, in order to keep the ohmic resistance sufficiently low, e.g. at the level below 30 nOhms*cm$^2$, preferably below 3 nOhms*cm$^2$. Note that typically, the total contact area of two coated conductor tapes is at least 100 cm$^2$, preferably at least 1000 cm$^2$.

We claim:

1. A superconducting structure comprising:
a plurality of coated conductor tapes, each tape having a substrate, wherein each substrate is coated on one side thereof with a superconducting film or with a YBCO film, the superconducting structure providing a superconducting current path along a z-direction of the superconducting structure, wherein said coated conductor tapes provide electrically parallel partial superconducting current paths in said z-direction of the superconducting structure, said coated conductor tapes being superconductively connected among themselves along said z-direction in a continuous or intermittent manner, the superconducting structure having a y-direction extending substantially parallel to planar extensions of said substrates and substantially perpendicular to said z-direction as well as an x-direction extending substantially perpendicular to said planar extensions of said substrates, wherein said coated conductor tapes are stacked in said x-direction in a closed ring shaped fashion, thereby forming a ring-shaped stack, wherein a circumferential direction of said ring-shaped stack extends substantially perpendicular to substrate planes.

2. The superconducting structure of claim 1, wherein free spaces in the superconducting structure not filled with coated conductor tapes are partially or completely filled with metal or a dielectric material.

3. The superconducting structure of claim 1, wherein free spaces in the superconducting structure not filled with coated conductor tapes are partially or completely filled with a cooling agent or are filled with a cooling agent having a mass flow in said z-direction.

4. The superconducting structure of claim 1, wherein the superconducting structure comprises at least one S-element, with two coated conductor tapes facing each other with respective superconducting film sides thereof, wherein said two coated conductor tapes are superconductively connected in a connection region, said two coated conductor tapes extending beyond said connection region on opposing sides in said y-direction.

5. The superconducting structure of claim 1, wherein each of two superconductively connected coated conductor tapes face each other with respective superconducting film sides, said superconducting films being electrically connected by directly touching each other, across a solder layer, across a solder layer of a noble metal or a noble metal alloy, across capping layers, across copper capping layers of said coated conductor tapes and said solder layer or of said solder layer made from a noble metal or a noble metal alloy.

6. A superconducting structure comprising:
a plurality of coated conductor tapes, each tape having a substrate, wherein each substrate is coated on one side thereof with a superconducting film or with a YBCO film, the superconducting structure providing a superconducting current path along a z-direction of the superconducting structure, wherein said coated conductor tapes provide electrically parallel partial superconducting current paths in said z-direction of the superconducting structure, said coated conductor tapes being superconductively connected among themselves along said z-direction in a continuous or intermittent manner, the superconducting structure having a y-direction extending substantially parallel to planar extensions of said substrates and substantially perpendicular to said z-direction as well as an x-direction extending substantially perpendicular to said planar extensions of said substrates, wherein said coated conductor tapes are stacked in said x-direction and the superconducting structure includes spacers filling spaces in at least one non-dense section of the superconducting structure in which less coated conductor tapes are stacked in said x-direction than in a dense section in which the coated conductor tapes neighboring in said x-direction abut each other.

7. The superconducting structure of claim 6, wherein said coated conductor tapes form a labyrinth structure comprising at least three levels of coated conductor tapes, wherein coated conductor tapes of each level are superconductively connected in a linear sequence which extends in said y-direction, said linear sequences of coated conductor tapes of said at least three levels substantially overlapping in said y-direction and coated conductor tapes of each pair of levels neighboring in an x-direction being superconductingly connected to each other via at least one associated respective coated conductor tape or via a lateral coated conductor tape of that level, wherein a balancing of currents within the superconducting structure is thereby established in said x-direction.

8. The superconducting structure of claim 6, wherein free spaces in the superconducting structure not filled with coated conductor tapes are minimized or coated conductor tapes neighboring in said x-direction flatly abut each other.

9. The superconducting structure of claim 6, wherein free spaces in the superconducting structure not filled with coated conductor tapes are partially or completely filled with metal or a dielectric material.

10. The superconducting structure of claim 6, wherein free spaces in the superconducting structure not filled with coated conductor tapes are partially or completely filled with a cooling agent or are filled with a cooling agent having a mass flow in said z-direction.

11. The superconducting structure of claim 6, wherein said coated conductor tapes are slightly curved in a cross-section perpendicular to said z-direction.

12. The superconducting structure of claim 6, wherein said coated conductor tapes are periodically arranged in said x-direction.

13. The superconducting structure of claim 6, wherein at least some of said coated conductor tapes are bent such that a first part of a width of said coated conductor tape is offset with respect to a second part of said coated conductor tape in said x-direction.

14. The superconducting structure of claim 6, wherein at least some coated conductor tapes within said stack are superconductively connected to a first further coated conductor tape and a second further coated conductor tape, wherein said first further coated conductor tape directly or indirectly establishes a superconducting connection of said coated conductor tape to coated conductor tapes above said coated conductor tape within said stack, wherein said second coated conductor tape directly or indirectly establishes a superconducting connection to coated conductor tapes below said coated conductor tape within said stack.

15. The superconducting structure of claim 6, wherein said spacers comprise coated conductor tape pieces which are not superconductively connected to an other coated conductor tape and which are bent inwardly.

16. The superconducting structure of claim 6, wherein the superconducting structure comprises at least one S-element, with two coated conductor tapes facing each other with respective superconducting film sides thereof, wherein said two coated conductor tapes are superconductively connected in a connection region, said two coated conductor tapes extending beyond said connection region on opposing sides in said y-direction.

17. The superconducting structure of claim 6, wherein each of two superconductively connected coated conductor tapes face each other with respective superconducting film sides, said superconducting films being electrically connected by directly touching each other, across a solder layer, across a solder layer of a noble metal or a noble metal alloy, across capping layers, across copper capping layers of said coated conductor tapes and said solder layer or of said solder layer made from a noble metal or a noble metal alloy.

18. A superconducting structure comprising:
a plurality of coated conductor tapes, each tape having a substrate, wherein each substrate is coated on one side thereof with a superconducting film or with a YBCO film, the superconducting structure providing a superconducting current path along a z-direction of the superconducting structure, wherein said coated conductor tapes provide electrically parallel partial superconducting current paths in said z-direction of the superconducting structure, said coated conductor tapes being superconductively connected among themselves along said z-direction in a continuous or intermittent manner, the superconducting structure having a y-direction extending substantially parallel to planar extensions of said substrates and substantially perpendicular to said z-direction as well as an x-direction extending substantially perpendicular to said planar extensions of said substrates, wherein the superconducting structure comprises at least one Y-element, each Y-element having two coated conductor tapes facing each other with respective superconducting film sides thereof, wherein said two coated conductor tapes are superconductingly connected along said z-direction continuously or intermittently in a connection region, and said two coated conductor tapes are spaced apart in said x-direction in a transfer region on one side of said connection region.

19. The superconducting structure of claim 18, wherein said coated conductor tapes are stacked in said x-direction in a closed ring shaped fashion, thereby forming a ring-shaped stack, wherein a circumferential direction of said ring-shaped stack extends substantially perpendicular to substrate planes.

20. The superconducting structure of claim 18, wherein said coated conductor tapes are stacked in said x-direction and the superconducting structure includes spacers filling spaces in at least one non-dense section of the superconducting structure in which less coated conductor tapes are stacked in said x-direction than in a dense section in which the coated conductor tapes neighboring in said x-direction abut each other.

21. The superconducting structure of claim 18, wherein said coated conductor tapes form a labyrinth structure comprising at least three levels of coated conductor tapes, wherein coated conductor tapes of each level are superconductively connected in a linear sequence which extends in said y-direction, said linear sequences of coated conductor tapes of said at least three levels substantially overlapping in said y-direction and coated conductor tapes of each pair of levels neighboring in an x-direction being superconductingly connected to each other via at least one associated respective coated conductor tape or via a lateral coated conductor tape of that level, wherein a balancing of currents within the superconducting structure is thereby established in said x-direction.

22. The superconducting structure of claim 18, wherein free spaces in the superconducting structure not filled with coated conductor tapes are minimized or coated conductor tapes neighboring in said x-direction flatly abut each other.

23. The superconducting structure of claim 18, wherein free spaces in the superconducting structure not filled with coated conductor tapes are partially or completely filled with metal or a dielectric material.

24. The superconducting structure of claim 18, wherein free spaces in the superconducting structure not filled with coated conductor tapes are partially or completely filled with a cooling agent or are filled with a cooling agent having a mass flow in said z-direction.

25. The superconducting structure of claim 18, wherein said coated conductor tapes are slightly curved in a cross-section perpendicular to said z-direction.

26. The superconducting structure of claim 18, wherein said coated conductor tapes are periodically arranged in said x-direction.

27. The superconducting structure of claim 18, wherein at least some of said coated conductor tapes are bent such that a first part of a width of said coated conductor tape is offset with respect to a second part of said coated conductor tape in said x-direction.

28. The superconducting structure of claim 18, wherein said coated conducting tapes form a stack in said x-direction with at least some coated conductor tapes within said stack being superconductively connected to a first further coated conductor tape and a second further coated conductor tape, wherein said first further coated conductor tape directly or indirectly establishes a superconducting connection of said coated conductor tape to coated conductor tapes above said coated conductor tape within said stack, wherein said second coated conductor tape directly or indirectly establishes a superconducting connection to coated conductor tapes below said coated conductor tape within said stack.

29. The superconductor structure of claim 18, wherein said two coated conductor tapes of said Y-element extend differently in said y-direction within said transfer region.

30. The superconducting structure of claim 18, wherein said Y-element comprises an additional transfer region in which said two coated conductor tapes are spaced apart in said x-direction, wherein said transfer region and said additional transfer region are separated by said connection region.

31. The superconducting structure of claim 18, wherein said two coated conductor tapes of said Y-element in said transfer region have protrusions and recesses in said y-direction which alternate in said z-direction, wherein said protrusions and recesses of said two coated conductor tapes are offset in said z-direction.

32. The superconducting structure of claim 18, wherein each of two superconductively connected coated conductor tapes face each other with respective superconducting film sides, said superconducting films being electrically connected by directly touching each other, across a solder layer, across a solder layer of a noble metal or a noble metal alloy, across capping layers, across copper capping layers of said coated conductor tapes and said solder layer or of said solder layer made from a noble metal or a noble metal alloy.

* * * * *